(12) United States Patent
Kim

(10) Patent No.: US 7,656,086 B2
(45) Date of Patent: Feb. 2, 2010

(54) ORGANIC LIGHT EMITTING DIODE DISPLAY AND METHOD OF MANUFACTURE THEREOF

(75) Inventor: Eun-Ah Kim, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 402 days.

(21) Appl. No.: 11/699,787

(22) Filed: Jan. 30, 2007

(65) Prior Publication Data

US 2008/0117143 A1   May 22, 2008

(30) Foreign Application Priority Data

Nov. 17, 2006   (KR) ...................... 10-2006-0113798

(51) Int. Cl.
*H01J 1/62* (2006.01)
(52) U.S. Cl. .......................... 313/506; 313/499; 257/10
(58) Field of Classification Search ......... 313/498–506; 445/23–25; 257/72, 40, 10
See application file for complete search history.

(56) References Cited

FOREIGN PATENT DOCUMENTS

| KR | 10-2003-0030286 A | 4/2003 |
|---|---|---|
| KR | 10-2005-0100888 A | 11/2005 |
| KR | 10-2005-0110792 A | 11/2005 |
| KR | 10-2006-0089818 A | 8/2006 |

*Primary Examiner*—Joseph L Williams
(74) *Attorney, Agent, or Firm*—Knobbe Martens Olson & Bear LLP

(57) ABSTRACT

An organic light emitting diode display having a driving circuit portion for driving an organic light emitting diode portion that includes a thin film transistor that has a semiconductor layer, a gate electrode, a source electrode, and a drain electrode, and is disposed between the organic light emitting diode portion and the driving circuit substrate, and a storage capacitor that has lower and upper electrodes and a dielectric layer interposed therebetween and is disposed on the organic light emitting diode portion is provided. The thin film transistor is formed between the organic light emitting diode portion and the driving circuit substrate, and the storage capacitor is formed on the organic light emitting diode portion.

13 Claims, 11 Drawing Sheets

ORGANIC LIGHT EMITTING DIODE DISPLAY AND METHOD OF MANUFACTURE THEREOF

CROSS-REFERENCE TO RELATED APPLICATION

This application claims priority to and the benefit of Korean Patent Application No. 10-2006-0113798 filed in the Korean Intellectual Property Office on Nov. 17, 2006, the entire content of which is incorporated herein by reference.

BACKGROUND OF THE INVENTION (a) Field of the Invention

The present invention relates to an organic light emitting diode (OLED) display and a method of manufacturing the OLED display, and more particularly, to an OLED display having an improved aperture ratio and a method of manufacturing the OLED display.

(b) Description of the Related Art

An OLED display is a flat display apparatus for driving NxM OLEDs with current or voltage to display an image.

The OLED displays may be classified into active and passive matrix driving types according to driving schemes.

The active matrix driving type of OLED display includes a driving circuit portion and an OLED unit having OLEDs that emit light according to driving signals from the driving circuit portion.

The driving circuit portion includes a plurality of thin film transistors (TFTs) and storage capacitors for driving the OLEDs. Generally, each of the TFTs includes a semiconductor layer, a gate electrode, a source electrode, and a drain electrode.

The semiconductor layer may be made of amorphous silicon (a-Si) or low temperature polysilicon (LTPS). Since mobility of the LTPS is higher than that of the a-Si, the LTPS is more suitable for a high-speed circuit. Therefore, recently, the LTPS has been widely used for the semiconductor layer.

However, a crystallization process of the LTPS is completed at a temperature of 400□ or more.

In a conventional method, in order to prevent damage to an organic layer of the OLED caused by the crystallization process of the LTPS, the driving circuit portion is firstly formed on a substrate, and then the OLED unit is formed on the driving circuit portion.

In addition, the active matrix driving type of OLED displays may be classified into bottom, top, and bottom-top emission types.

In the bottom-emission active matrix driving type of OLED display, light emitting from the organic layer of the OLED passes through a space where the driving circuit portion is not formed so as to display an image. Since the aperture ratio decreases by the space where the driving circuit portion is formed, there is a problem in that the aperture ratio may be lowered to below 40% or less.

On the other hand, in the top-emission active matrix driving type of OLED display, the aperture ratio can be improved by up to 60% to 70%. However, first pixel electrodes of the OLED unit must be made of a reflective conductive material, and second pixel electrode of the OLED unit must be made of a transparent or semi-transparent conductive material.

Dark-point defects may be caused by contamination occurring during a process of generating the first pixel electrodes. In addition, in a case where the second pixel electrodes are formed to be thin so as to improve transmittance, pin holes may occur, and the organic layer may deteriorate.

SUMMARY OF THE INVENTION

The present invention provides a bottom emission type of organic light emitting diode display with an improved aperture ratio.

The present invention also provides a method of effectively manufacturing the organic light emitting diode display.

According to an aspect of the present invention, there is provided an organic light emitting diode display including a driving circuit portion for driving an organic light emitting diode portion, the driving circuit portion including: a thin film transistor that includes a semiconductor layer, a gate electrode, a source electrode, and a drain electrode; and a storage capacitor that includes lower and upper electrodes and a dielectric layer interposed therebetween.

The thin film transistor may be disposed between the organic light emitting diode portion and a driving circuit substrate, and the storage capacitor may be disposed on the organic light emitting diode portion.

In the organic light emitting diode display, since the storage capacitor is disposed on the organic light emitting diode portion, it is possible to improve the aperture ratio by an area of the storage capacitor when the light emitting from the organic light emitting diode portion passes through the driving circuit portion to display an image.

In the above aspect of the present invention, the first pixel electrode may be made of a transparent or semi-transparent conductive material, and the second pixel electrode may be made of a reflective conductive material. In addition, the first pixel electrode, the second pixel electrode, and the lower electrode may be formed on each of subpixels individually.

In addition, a passivation layer may be disposed between the second pixel electrode and the lower electrode.

Accordingly, it is possible to suppress deterioration of the organic layer caused by an inflow of moisture into the organic light emitting diode display.

In addition, the semiconductor layer and the first pixel electrode may be electrically connected to the source or drain electrode of the thin film transistor, and the second pixel electrode may be electrically connected to the gate electrode of the thin film transistor.

In the organic light emitting diode display, since all the components, that is, the semiconductor layer, the gate electrode, the source and drain electrodes, the first pixel electrode, and the second pixel electrode, can be used for the electrodes of the capacitor, it is possible to further improve capacitance of the capacitor.

The semiconductor layer may be made of a low temperature polysilicon. The first pixel electrode may be used as an anode, and the second pixel electrode may be used as a cathode.

According to an aspect of the present invention, there is provided a method of manufacturing an organic light emitting diode display including: forming a thin film transistor on a driving circuit substrate; forming a first pixel electrode on the thin film transistor; forming an organic layer on the first pixel electrode; forming a second pixel electrode on the organic layer; forming a passivation layer on the second pixel electrode; forming a lower electrode of a storage capacitor on the passivation layer; forming a dielectric layer on the lower electrode; and forming an upper electrode of the storage capacitor on the dielectric layer.

The first pixel electrode, the second pixel electrode, and the lower electrode may be formed by using a lift-off process and a dry-type process using a shadow mask.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF THE EMBODIMENTS

Hereinafter, exemplary embodiments of the present invention will be described in detail with reference to the attached drawings such that the present invention can be easily put into practice by those skilled in the art. However, the present invention is not limited to the exemplary embodiments, but may be embodied in various forms.

If it is mentioned that a layer, a film, an area, or a plate is placed on a different element, it includes a case that the layer, film, area, or plate is placed right on the different element, as well as a case that another element is disposed therebetween.

In the embodiments described later, a driving circuit portion which is formed in each subpixel with a 2Tr-1Cap structure constructed with two thin film transistors (TFTs) and a storage capacitor is exemplified.

However, the structure of the driving circuit portion is not limited thereto, but may be modified in various forms according to applications.

FIGS. 1 to 10 are perspective views showing a method of manufacturing an OLED display according to an embodiment of the present invention.

Figure 1:
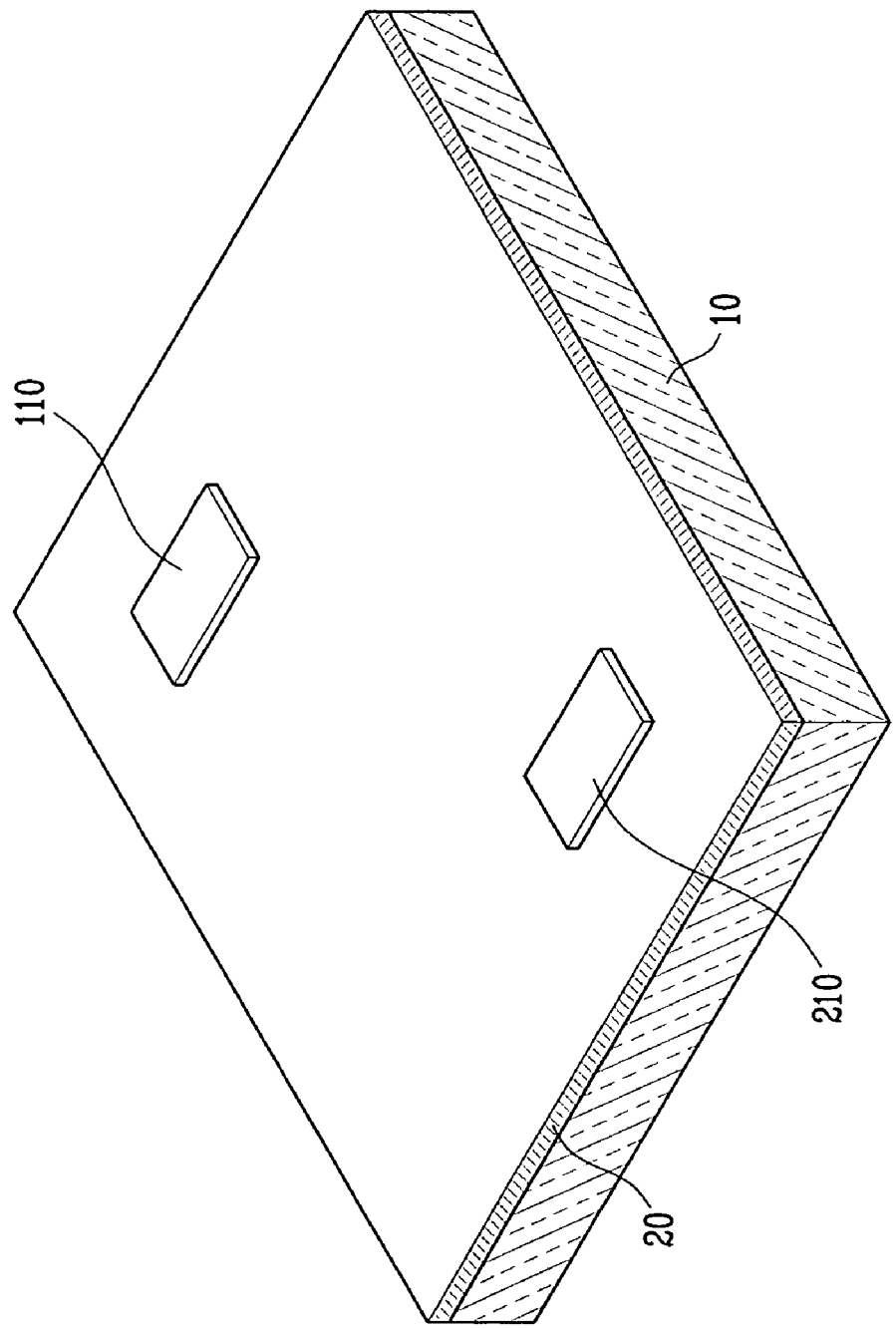
FIG. 1 is a schematic perspective view showing first and second semiconductor layers formed in an OLED display according to an embodiment of the present invention.
Figure 2:
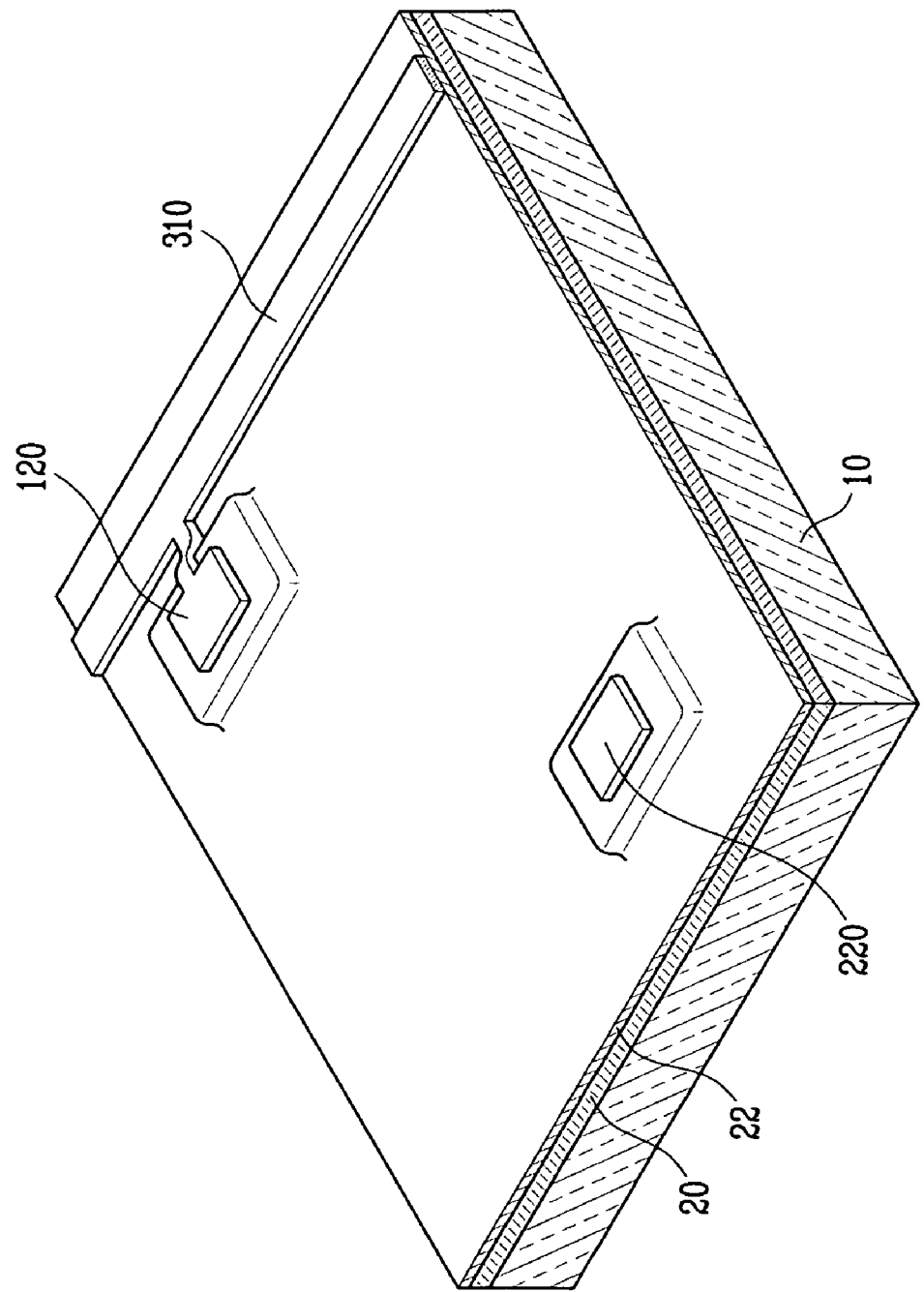
FIG. 2 is a schematic perspective view showing a gate insulating film and a gate wire line formed in the OLED display according to the embodiment of the present invention.
Figure 3:
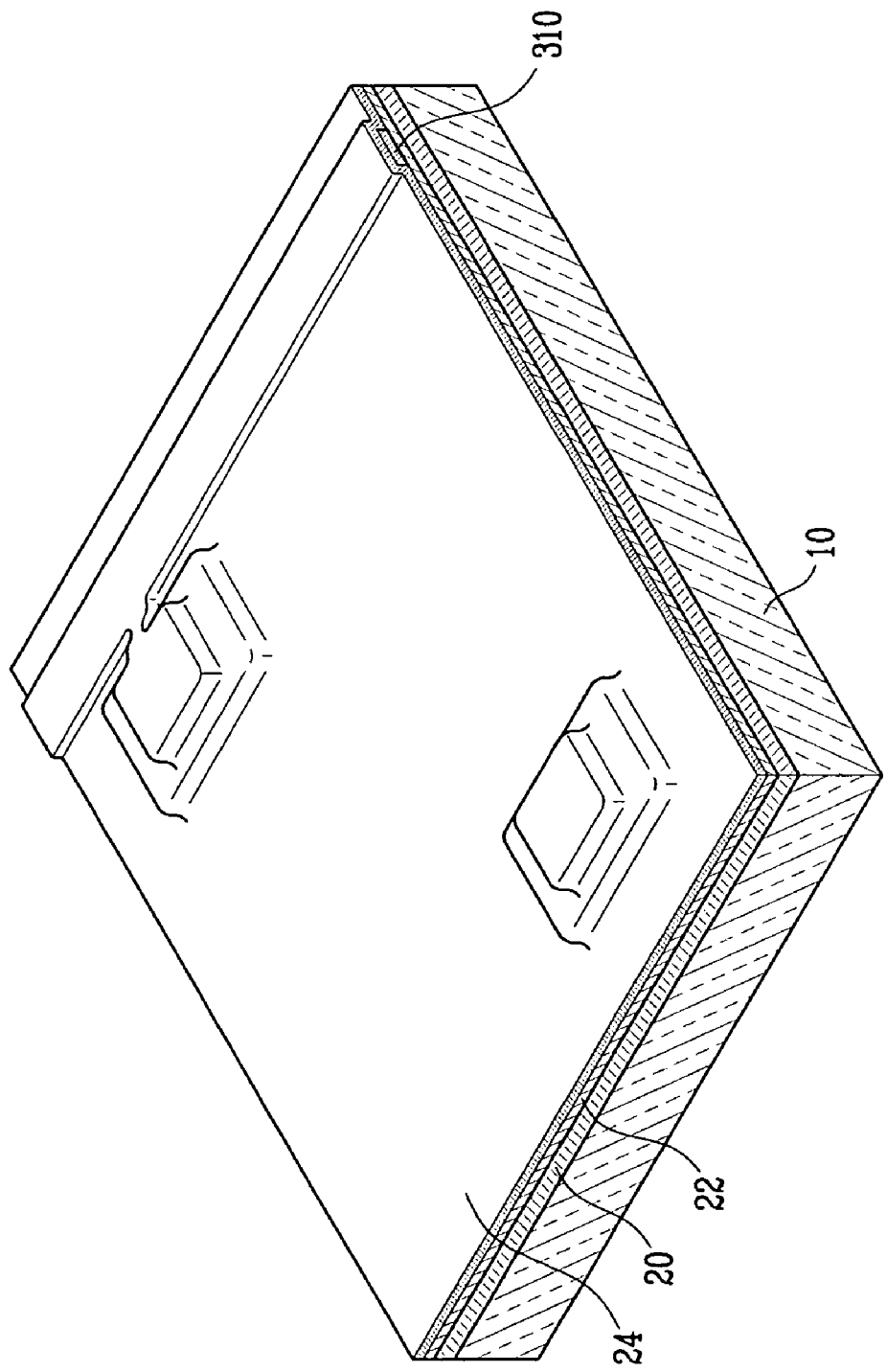
FIG. 3 is a schematic perspective view showing an interlayer insulating film formed in the OLED display according to the embodiment of the present invention.

More specifically, FIG. 1 is a schematic perspective view showing first and second semiconductor layers formed in the OLED display, FIG. 2 is a schematic perspective view showing a gate insulating film and a gate wire line formed in the OLED display, and FIG. 3 is a schematic perspective view showing an interlayer insulating film formed in the OLED display.

Figure 4:
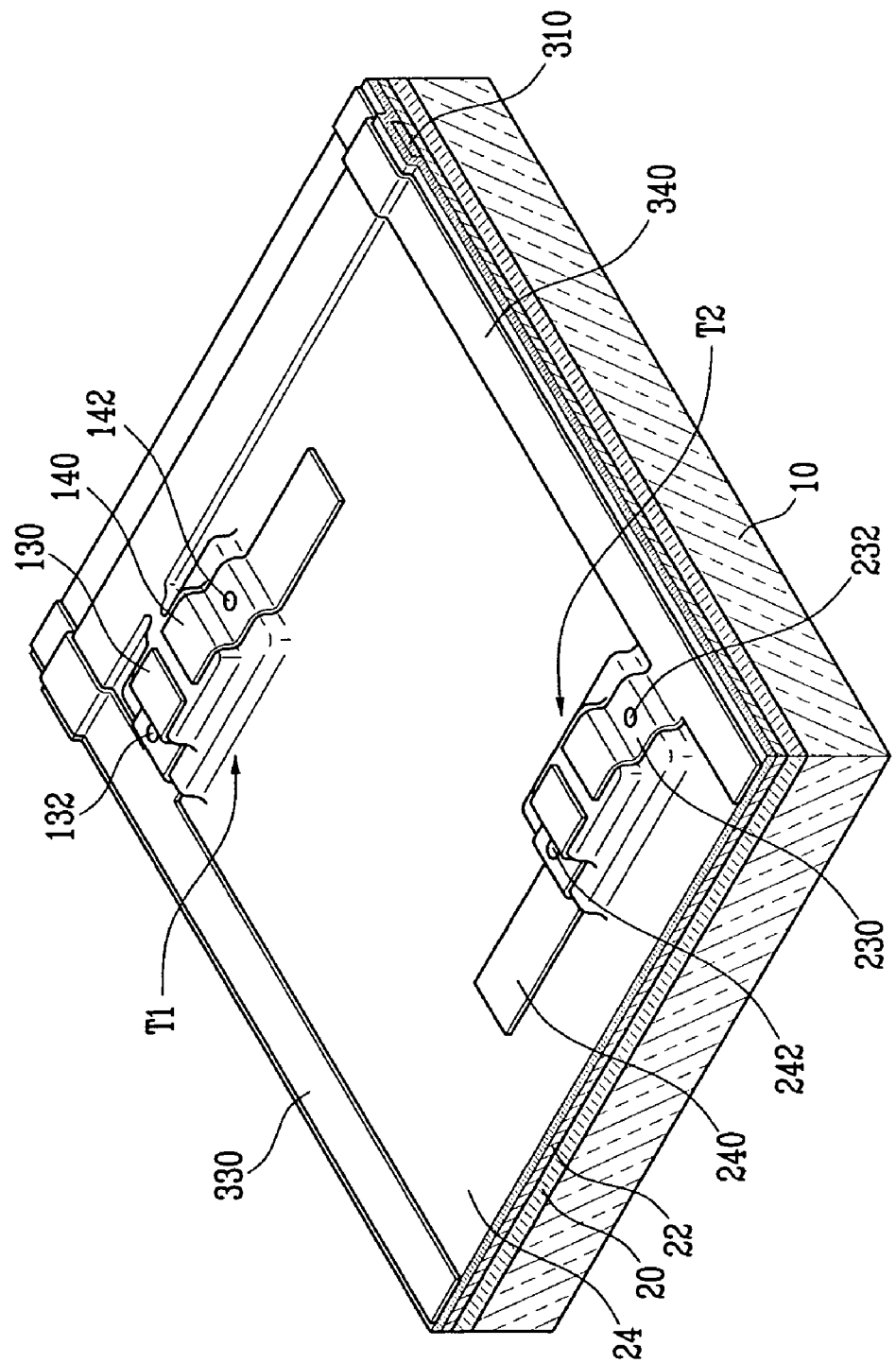
FIG. 4 is a schematic perspective view showing source and drain wire lines formed in the OLED display according to the embodiment of the present invention.
Figure 5:
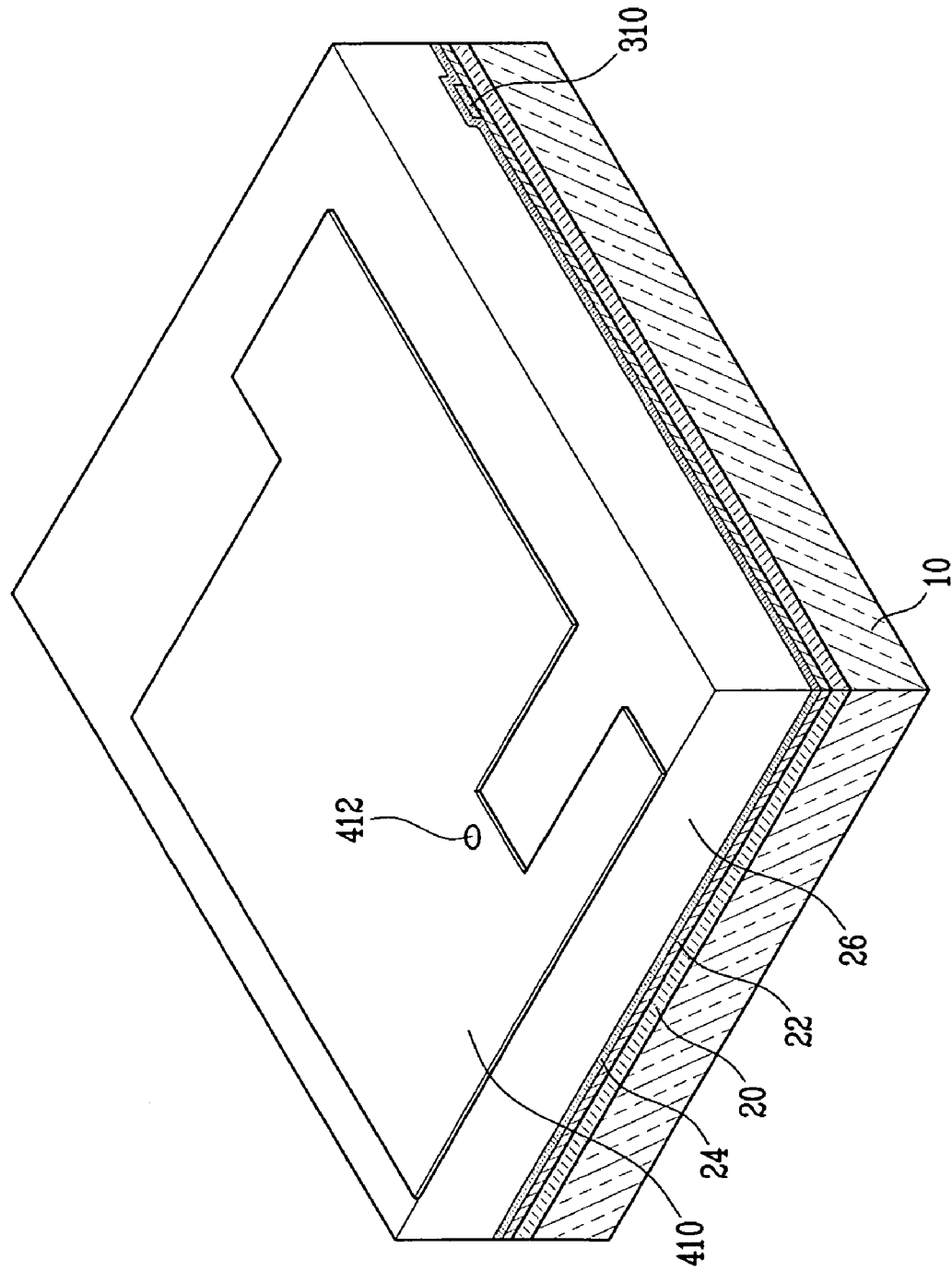
FIG. 5 is a schematic perspective view showing a planarization film and a first pixel electrode formed in the OLED display according to the embodiment of the present invention.
Figure 6:
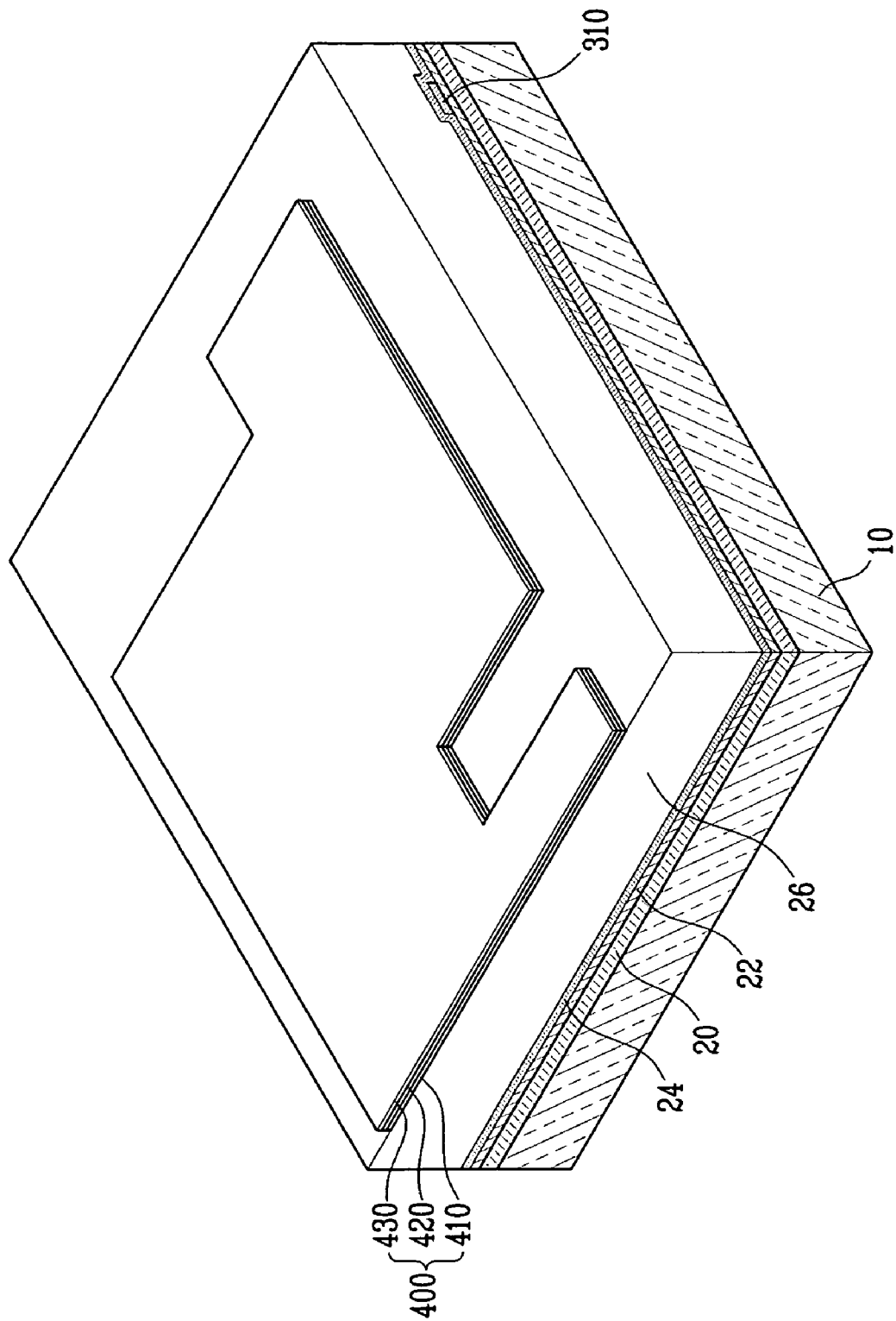
FIG. 6 is a schematic perspective view showing an organic layer and a second pixel electrode formed in the OLED display according to the embodiment of the present invention.

FIG. 4 is a schematic perspective view showing source and drain wire lines formed in the OLED display, FIG. 5 is a schematic perspective view showing a planarization film and a first pixel electrode formed in the OLED display, and FIG. 6 is a schematic perspective view showing an organic layer and a second pixel electrode formed in the OLED display.

Figure 7:
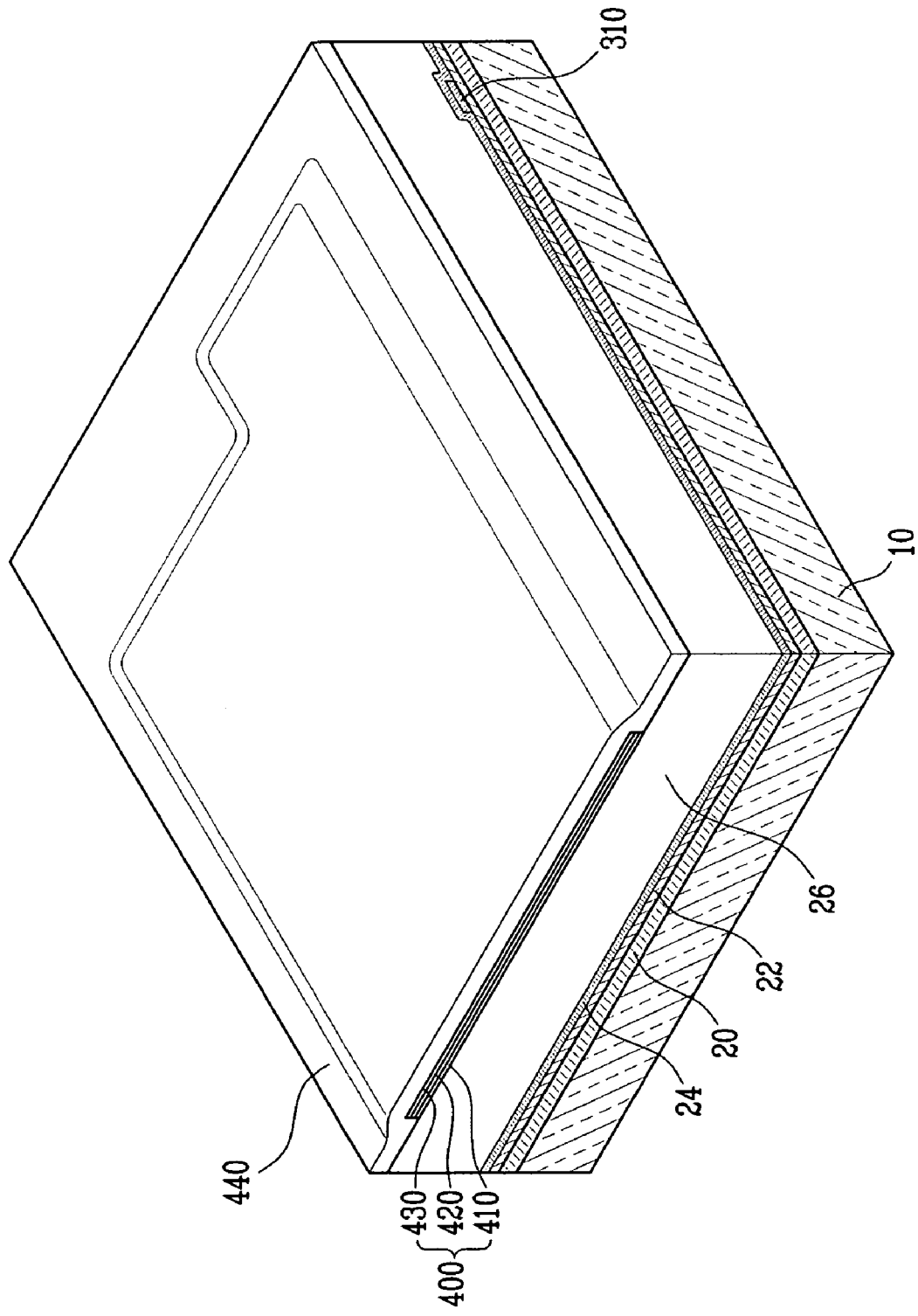
FIG. 7 is a schematic perspective view showing a passivation layer formed in the OLED display according to the embodiment of the present invention.

FIG. 7 is a schematic perspective view showing a passivation layer formed in the OLED display.

Figure 8:
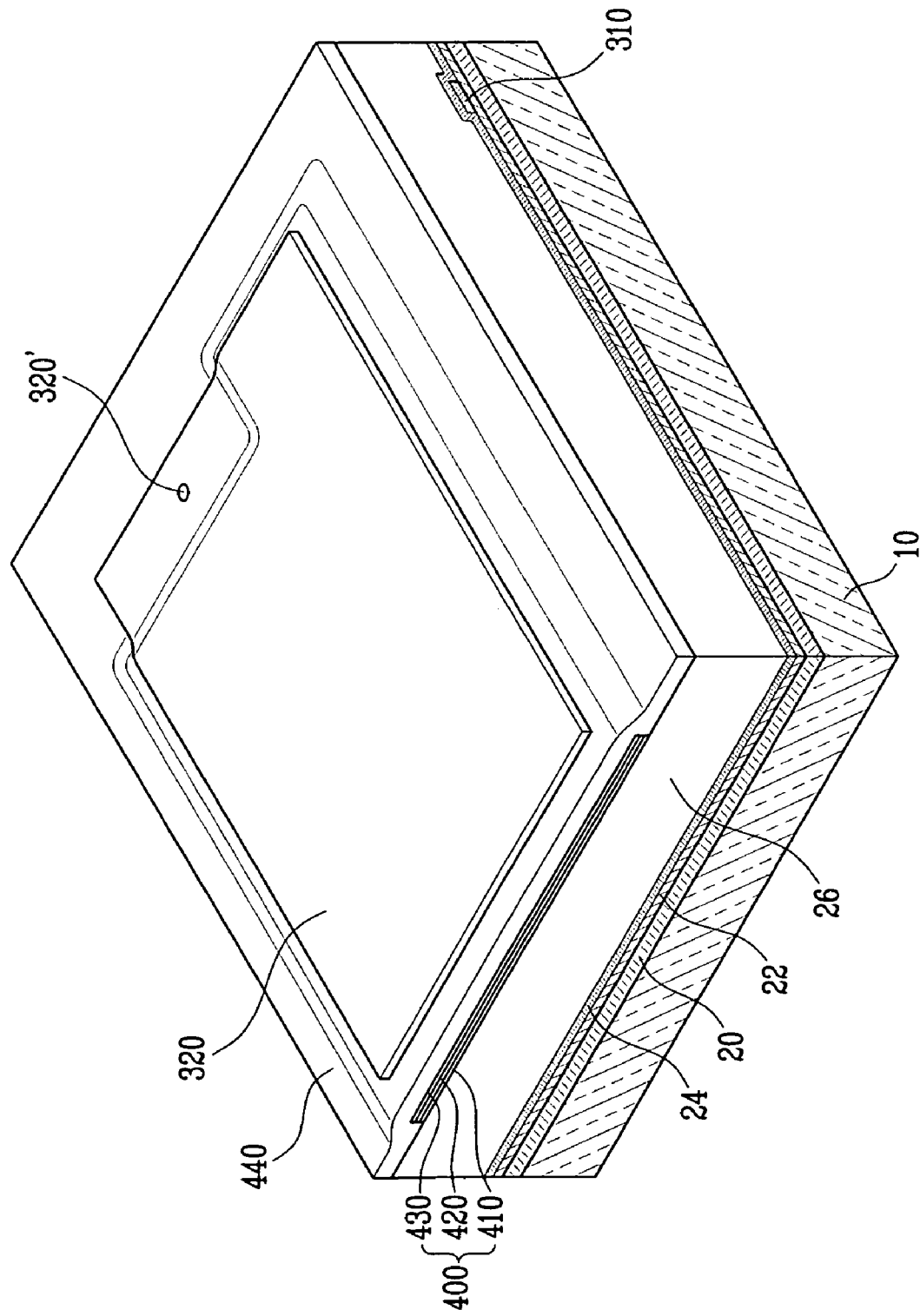
FIG. 8 is a schematic perspective view showing a lower electrode of a storage capacitor formed in the OLED display according to the embodiment of the present invention.
Figure 9:
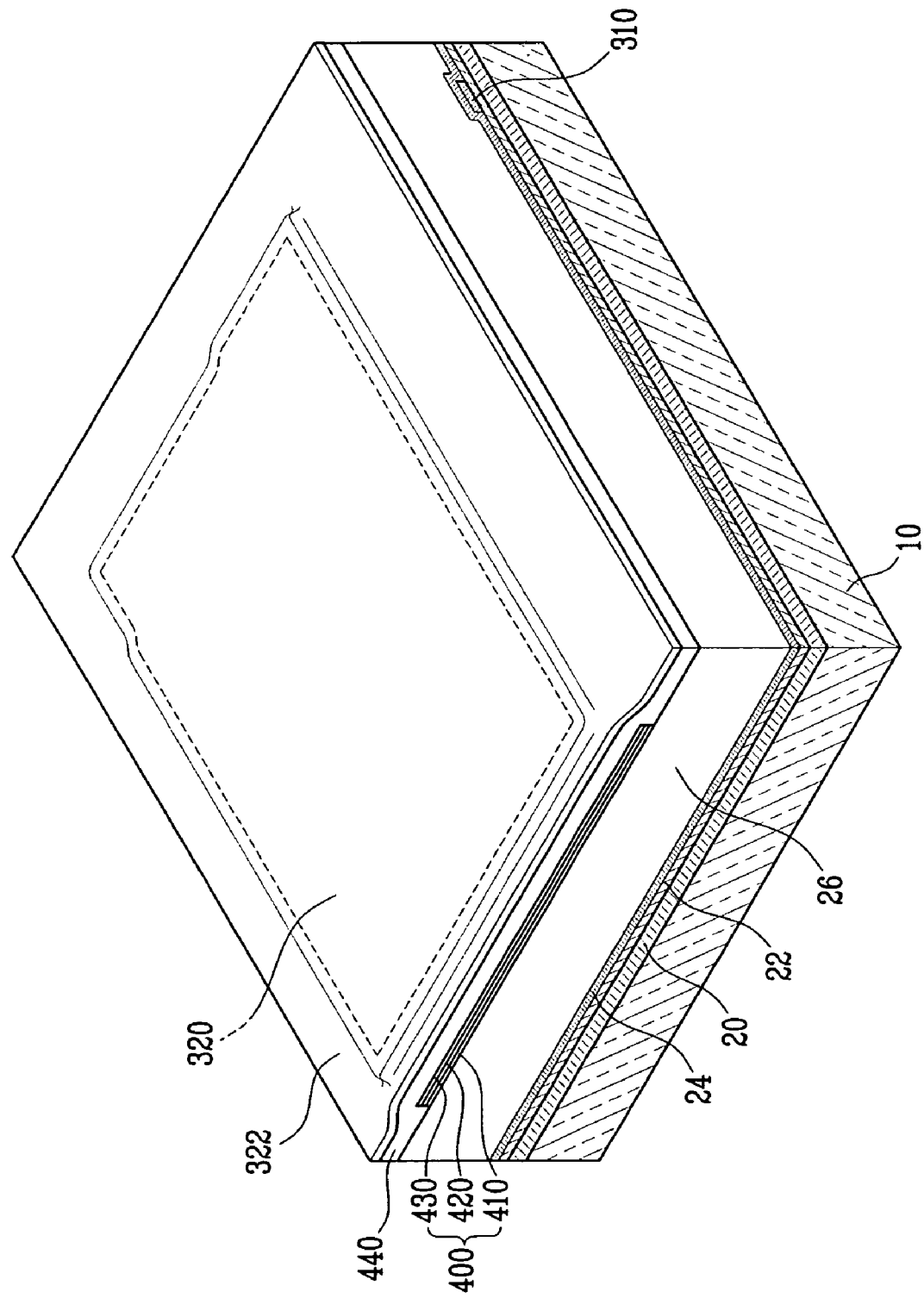
FIG. 9 is a schematic perspective view showing a dielectric layer formed in the OLED display according to the embodiment of the present invention.
Figure 10:
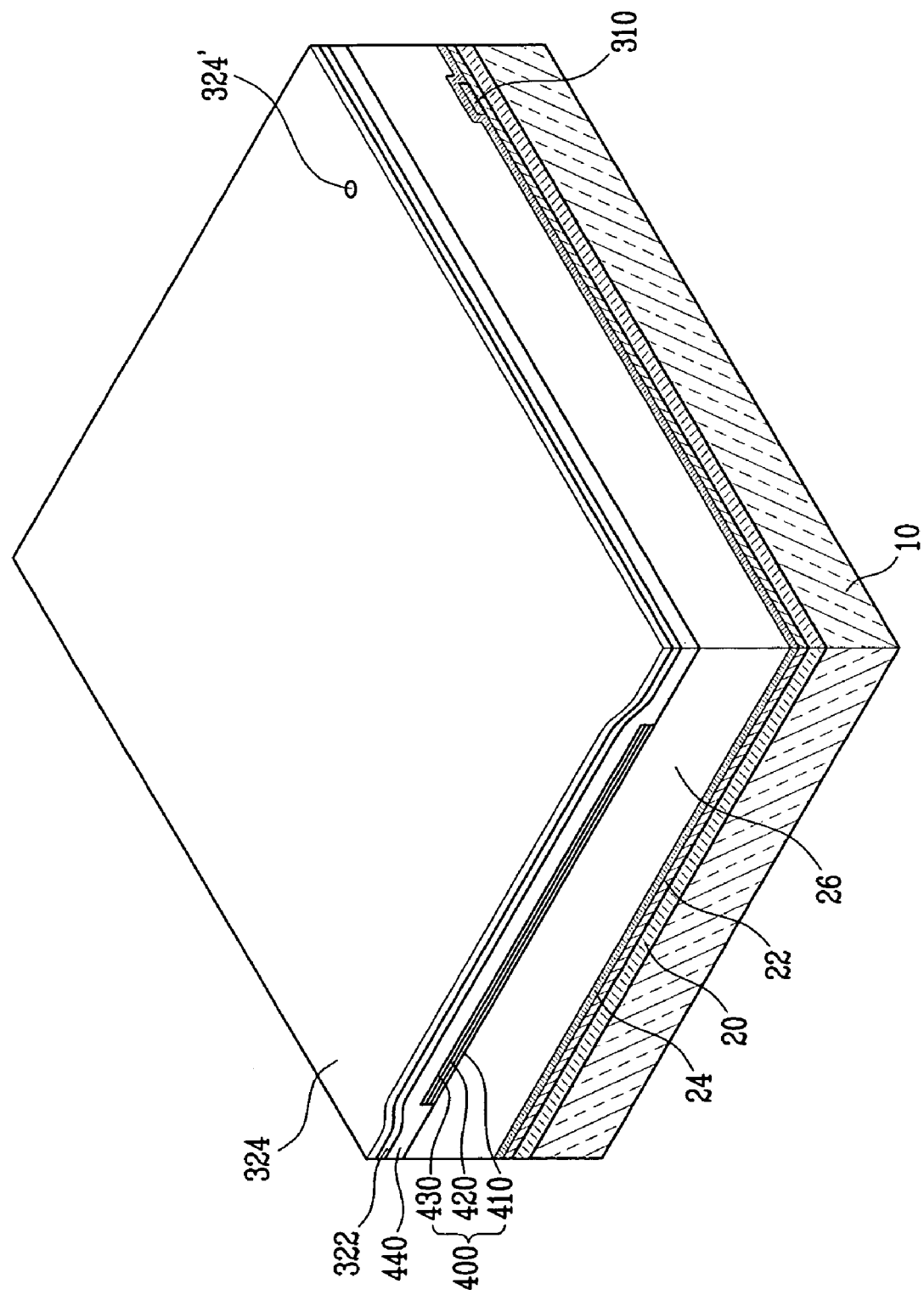
FIG. 10 is a schematic perspective view showing an upper electrode of the storage capacitor formed in the OLED display according to the embodiment of the present invention.

FIGS. 8 to 10 are schematic perspective views showing a lower electrode, a dielectric layer, and an upper electrode of a storage capacitor formed sequentially in the OLED display.

Figure 11:
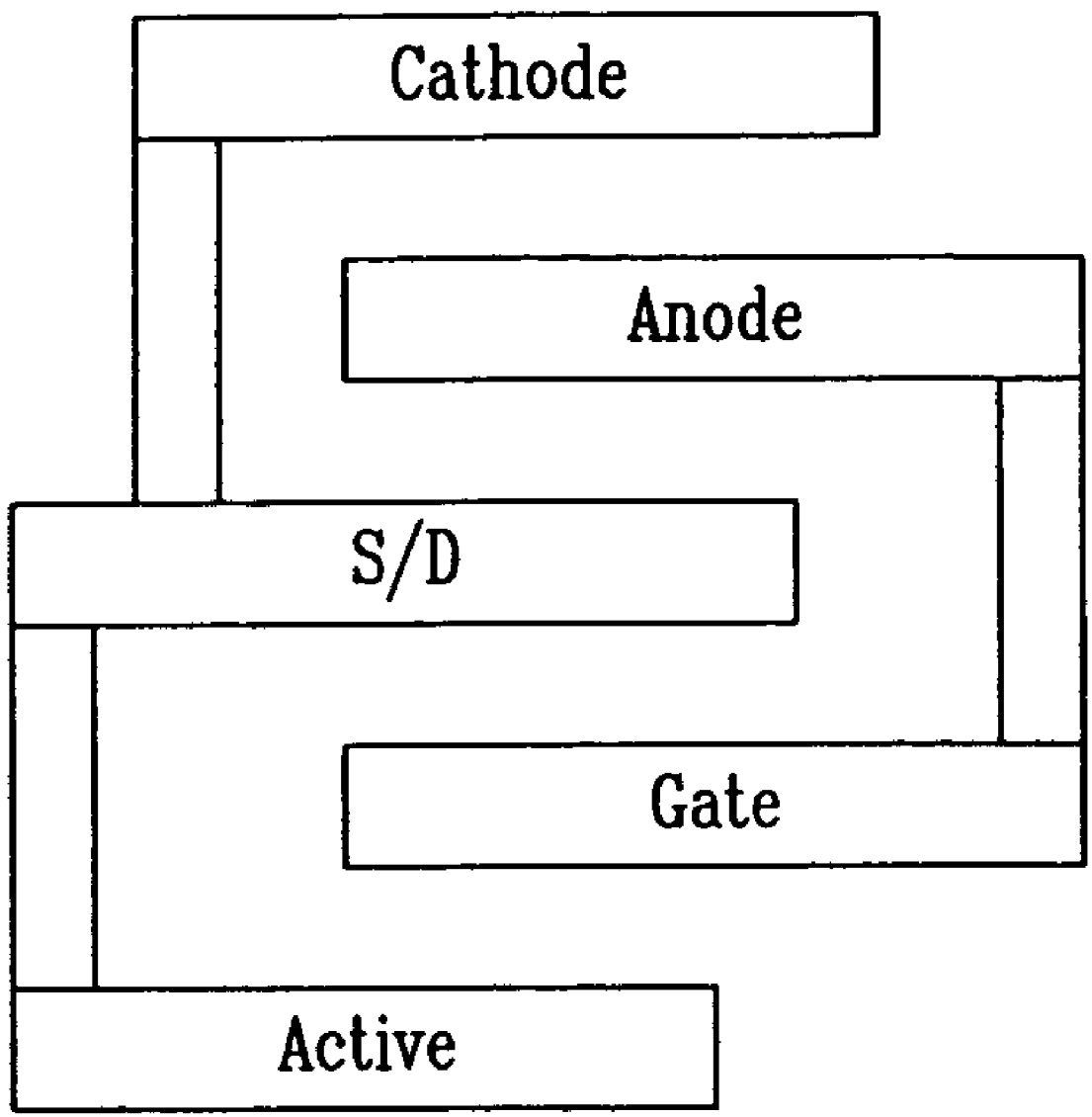
FIG. 11 is a schematic perspective view showing an electrical connection of a second pixel electrode used for an electrode of a capacitor in the OLED display according to the embodiment of the present invention.

FIG. 11 is a schematic perspective view showing an electrical connection of a second pixel electrode used for an electrode of a capacitor in the OLED display.

Firstly, a method of manufacturing an OLED display according to an embodiment of the present invention is described with reference to FIGS. 1 to 10.

The OLED display includes a driving circuit substrate 10. The driving circuit substrate 10 may be a transparent glass substrate or an opaque resin substrate. Alternatively, the driving circuit substrate 10 may be a metal foil.

For simplification of the drawings, a driving circuit substrate in one subpixel region where the driving circuit portion is formed is shown in FIGS. 1 to 10.

As shown in FIG. 1, a buffer layer 20 is formed on the driving circuit substrate 10. Next, first and second semiconductor layers 110 and 120 are formed on first and second thin film transistor (TFT) regions above the buffer layer 20, respectively.

Although not shown in detail, each of the first and second semiconductor layers 110 and 120 may be made of low temperature polysilicon (LTPS) and have source and drain regions and a channel region interposed therebetween.

Next, as shown in FIG. 2, a gate insulating film 22 is formed, and a gate wire line is formed on the gate insulating film 22.

The gate wire line may include a first gate electrode 120, a scan line 310 that is integrally formed with the first gate electrode 120, and a second gate electrode 220.

Next, as shown in FIGS. 3 and 4, an interlayer insulating film 24 and source and drain wire lines are sequentially formed.

The source and drain wire lines may include source and drain electrodes 130 and 140 of a first TFT T1 and a data line 330 that is integrally formed with the source electrode 130 of the first TFT T1.

In addition, the source and drain wire lines may further include source and drain electrodes 230 and 240 of a second TFT T2 and a common power source line 340 that is integrally formed together with the source electrode 230 of the second TFT T2.

The data line 330 is formed to extend in a direction perpendicular to the scan line 310. The source electrode 130 of the first TFT T1 is electrically connected to the source region of the first semiconductor layer 110 through a via hole 132.

The drain electrode 140 of the first TFT T1 is electrically connected to the drain region of the first semiconductor layer 110 through a via hole 142.

The source electrode 230 of the second TFT T2 is electrically connected to the source region of the second semiconductor layer 210 through a via hole 232. The drain electrode 240 of the second TFT T2 is electrically connected to the drain region of the second semiconductor layer 210 through a via hole 242.

The common power supply line 340 is formed to extend in a direction perpendicular to the scan line 310 and to face the data line 330. The common power supply line 340 is integrally formed together with the source electrode 230 of the second TFT T2.

Next, as shown in FIG. 5, a planarization film 26 is formed, and a first pixel electrode 410 is formed above the planarization film 26.

The first pixel electrode 410 may be an anode electrode used as a hole injection electrode. The first pixel electrode 410 may be formed of a transparent or semi-transparent conductive material such as indium tin oxide (ITO) or indium zinc oxide (IZO).

The first pixel electrode 410 is electrically connected to the drain electrode 240 of the second TFT T2 through a via hole 412.

Next, as shown in FIG. 6, an organic layer 420 and a second pixel electrode 430 are sequentially formed on the first pixel electrode 410.

The second pixel electrode 430 may be a cathode electrode used as an electron injection electrode.

Moreover, the positions of the first and second pixel electrodes may be interchanged according to a specification of a product.

The second pixel electrode 430 may be constructed with a reflective conductive layer so as to reflect light emitting from the organic layer 420 toward the driving circuit substrate 10 or to improve a work function or electrical conductivity between the transparent conductive electrode and the second pixel electrode 430.

Generally, the second pixel electrode 430 may be made of one of aluminum (Al), an Al alloy, silver (Ag), a Ag alloy, gold (Au), and a Au alloy.

The organic layer 420 may be constructed with a multi-layered structure which multiple organic layers are stacked above and below a light emitting layer so as to efficiently transport carrier such as holes and electrons to the light emitting layer.

For example, the organic layer 420 may be constructed with a multi-layered structure where a hole injection layer, a hole transport layer, a light emitting layer, a hole blocking layer, an electron transport layer, and an electron injection layer are sequentially stacked on the first pixel electrode of the OLED.

Small-molecule materials used to form the multi-layer organic layer may be classified into a hole injection material, a hole transport material, a hole blocking material, an electron transport material, and a light emitting material according to functions thereof.

In addition, the small-molecule materials may be classified into a fluorescent material originating from a singlet exciton and a phosphorescent material originated from a triplet exciton. In addition, the small-molecule materials may be classified into blue, red, yellow, and orange light emitting materials according to colors thereof.

The small-molecule light-emitting materials may be classified into host and dopant materials according to a function thereof. In addition, the small-molecule light-emitting materials may be classified into an organic host material, an organic metallic host material, an organic dopant material, and an organic metallic dopant material.

In general, light can be emitted by using only the host or dopant material. However, in this case, efficiency and luminance are lowered. In addition, since the molecules are close to each other, there is a problem in that excimer characteristics unique to the molecules occur.

The structure of the organic layer of the OLED and a manufacturing process thereof vary with types of the small-molecule materials.

The first pixel electrode 410, the organic layer 420, and the second pixel electrode 430 constitute the OLED 400.

Subsequently, as shown in FIG. 7, a passivation layer 440 is formed. The passivation layer 440 has a function of preventing moisture from flowing into the organic layer 420.

As shown in FIG. 8, after the formation of the passivation layer 440, a lower electrode 320 of the storage capacitor is formed, and the lower electrode 320 is electrically connected to the drain electrode 140 of the first TFT T1 through a via hole 320'.

Next, as shown in FIGS. 9 and 10, a dielectric layer 322 is formed, and an upper electrode 324 of the storage capacitor is formed on the dielectric layer 322. The upper electrode 324 is electrically connected to the common power supply line 340 through a via hole 324'.

As shown in the drawings, the first pixel electrode, the organic layer, the second pixel electrode, and the lower electrode of the storage capacitor are formed on each of the subpixels individually and are individually driven according to a signal of the driving circuit portion.

A common layer used among the aforementioned organic layers may be formed on the entire area of the OLED display.

Therefore, the first pixel electrode, the organic layer, the second pixel electrode, and the lower electrode of the storage capacitor may be formed by using a dry-type process.

As an example of the dry-type process, there are a deposition process using a shadow mask, and a lift-off process.

In some of the processes, after all the structures are formed on the driving circuit substrate 10, a sealing process using an encapsulation glass, a metal cap, or a sealing thin film is performed.

According to the embodiment of the present invention, the lower and upper electrodes of the storage capacitor are formed on the second pixel electrode.

Therefore, in the OLED display according to the embodiment of the present invention, the area of the first pixel electrode can increase by the area or more of the storage capacitor, so that the aperture ratio can be improved.

In addition, since the first pixel electrode without a reflective layer and the relatively thick second pixel electrode can be employed, it is possible to prevent occurrence and spreading of pin holes and to improve the aperture ratio.

In addition, since the organic layer is formed after the formation of a thin film transistor, it is possible to form the organic layer without damage thereto.

On the other hand, as described above, the second pixel electrode and the lower electrode are formed on each of the subpixels individually so as to form the lower and upper electrodes of the storage capacitor on the second pixel electrode.

Accordingly, it is possible to further improve capacitance of a capacitor by electrically connecting some of the TFTs formed on the subpixels with the second pixel electrode.

Namely, the capacitance of the capacitor increases in proportion to the area of the conductive material.

Therefore, as shown in FIG. 11, one electrode of a capacitor is formed by electrically connecting semiconductor layers formed with some of the TFTs with the source and drain electrodes S/D and the first pixel electrode.

Next, the other electrode of the capacitor is formed by electrically connecting the gate electrode of the TFT with the second pixel electrode, that is, a cathode.

According to the formation of the electrodes of the capacitor, all of the conductive materials, that is, the semiconductor layer, the gate electrode, the source and drain electrodes, the first pixel electrode, and the second pixel electrode can be used for the electrodes of the capacitor.

Accordingly, it is possible to improve the capacitance of the capacitor, so that the aperture ratio can be further improved.

Although the exemplary embodiments of the present invention have been described, the present invention is not limited to the embodiments, but may be modified in various forms without departing from the scope of the appended claims, the detailed description, and the accompanying drawings of the present invention. Therefore, it is natural that such modifications belong to the scope of the present invention.

What is claimed is:

1. An organic light emitting diode display, comprising:
a driving circuit substrate;
an organic light emitting diode portion that includes a first pixel electrode, an organic layer, and a second pixel electrode, and is disposed on the driving circuit substrate; and
a driving circuit portion that drives the organic light emitting diode portion,
wherein the driving circuit portion comprises
a thin film transistor including a semiconductor layer, a gate electrode, a source electrode, and a drain electrode and that is disposed between the organic light emitting diode portion and the driving circuit substrate, and
a storage capacitor that includes lower and upper electrodes and a dielectric layer interposed therebetween and that is disposed on the organic light emitting diode portion.

2. The organic light emitting diode display of claim 1, wherein the first pixel electrode is made of a transparent or semi-transparent conductive material, and the second pixel electrode is made of a reflective conductive material.

3. The organic light emitting diode display of claim 2, wherein the first pixel electrode, the second pixel electrode, and the lower electrode are formed on each of subpixels individually.

4. The organic light emitting diode display of claim 3, wherein a passivation layer is disposed between the second pixel electrode and the lower electrode.

5. The organic light emitting diode display of claim 4,
wherein the semiconductor layer and the first pixel electrode are electrically connected to the source or drain electrode of the thin film transistor, and
wherein the second pixel electrode is electrically connected to the gate electrode of the thin film transistor.

6. The organic light emitting diode display of claim 4, wherein the semiconductor layer is made of a low temperature polysilicon.

7. The organic light emitting diode display of claim 6, wherein the first pixel electrode is used as an anode, and the second pixel electrode is used as a cathode.

8. An organic light emitting diode display comprising:
a thin film transistor that includes a semiconductor layer, a gate electrode, a source electrode, and a drain electrode, and that is disposed on a driving circuit substrate;
a first pixel electrode that is formed on the thin film transistor and is driven individually in units of subpixels;
an organic layer formed on the first pixel electrode;
a second pixel electrode that is formed on the organic layer and is driven individually in units of subpixels;
a lower electrode of a storage capacitor that is formed on the second pixel electrode and is driven individually in units of subpixels;
a dielectric layer that is formed on the lower electrode; and
an upper electrode of the storage capacitor that is formed on the dielectric layer.

9. The organic light emitting diode display of claim 8, wherein the first pixel electrode is made of a transparent or semi-transparent conductive material, and the second pixel electrode is made of a reflective conductive material.

10. The organic light emitting diode display of claim 9, wherein a passivation layer is disposed between the second pixel electrode and the lower electrode.

11. The organic light emitting diode display of claim 10,
wherein the semiconductor layer and the first pixel electrode are electrically connected to the source or drain electrode of the thin film transistor, and
wherein the second pixel electrode is electrically connected to the gate electrode of the thin film transistor.

12. The organic light emitting diode display of claim 10, wherein the semiconductor layer is made of a low temperature polysilicon.

13. The organic light emitting diode display of claim 12, wherein the first pixel electrode is used as an anode, and the second pixel electrode is used as a cathode.

* * * * *